(12) United States Patent
Willson et al.

(10) Patent No.: US 6,334,960 B1
(45) Date of Patent: Jan. 1, 2002

(54) STEP AND FLASH IMPRINT LITHOGRAPHY

(75) Inventors: Carlton Grant Willson, Austin, TX (US); Matthew Earl Colburn, Waukesha, WI (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/266,663

(22) Filed: Mar. 11, 1999

(51) Int. Cl.$^7$ .................................................. B44C 1/22
(52) U.S. Cl. .............................. 216/52; 216/2; 216/44; 216/67; 216/72
(58) Field of Search ................................ 216/2, 44, 52, 216/67, 72, 13

(56) References Cited

U.S. PATENT DOCUMENTS

| | | | |
|---|---|---|---|
| 4,731,155 A | | 3/1988 | Napoli et al. ................ 156/643 |
| 4,959,252 A | * | 9/1990 | Bonnebat et al. ............. 428/64 |
| 5,110,514 A | * | 5/1992 | Soane ......................... 264/22 |
| 5,126,006 A | | 6/1992 | Cronin et al. ................ 156/643 |
| 5,240,550 A | * | 8/1993 | Boehnke et al. ............... 216/24 |
| 5,480,047 A | * | 1/1996 | Tanigawa et al. .............. 216/24 |
| 5,545,367 A | * | 8/1996 | Bae et al. .................... 264/401 |
| 5,772,905 A | * | 6/1998 | Chou .......................... 216/44 |
| 5,888,650 A | * | 3/1999 | Calhoun et al. ............. 428/354 |
| 6,046,056 A | * | 4/2000 | Parce et al. ................. 436/514 |
| 6,074,827 A | * | 6/2000 | Nelson et al. ................. 435/6 |
| 6,168,845 B1 | | 1/2001 | Fontana, Jr. et al. ....... 428/65.5 |

FOREIGN PATENT DOCUMENTS

| | | | |
|---|---|---|---|
| DE | 2800476 A | 7/1978 | ............ G03C/5/08 |
| EP | 0244884 A1 | 11/1987 | ............ B29C/33/64 |
| JP | 01196749 A | 8/1989 | ............ G11B/7/26 |

OTHER PUBLICATIONS

Haisma, J. et al "Mold–assisted nanolithography: A process for reliable pattern replication" J Vac Sci Technol B 14(6), 4124–8, 11/1996.*

Kotachi et al "Si–Containing Positive Resist for ArF Excimer Laser Lithography" J Photopolymer Sci Technol 8(4) 615–622, 1995.*

Cowie, J.M.G. "Polymers: Chemistry and Physics of Modern Materials" 2nd ed., 1991, pp. 408–409.*

Chou et al.: Imprint Lithography with 25–Nanometer Resolution, Science, vol. 272, Apr. 5, 1996, pp. 85–87.

Chou et al.; Imprint Lithography with Sub–10 nm Feature Size and High Throughput, Microelectronic Engineering 35 (1997) 237–240.

Haisma et al.; Mold–assisted Nanolithography: A Process for Reliable Pattern Replication, J. Vac. Sci. Technol. B 14(6), Nov./Dec. 1996, pp. 1424–1428.

Kotachi et al.; Si–Containing Positive Resist for ArF Excimer Laser Lithography, Journal of Photopolymer Science and Technology, 8(4) (1995) 615–622.

Krauss, et al.; Fabrication of Nanodevices Using Sub–25 nm Imprint Lithography, Appl. Phys. Lett., 67(21), 3114–3116, 1995.

Xia et al.: Soft Lithography, Angew. Chem. Int. Ed., 1998 37 550–575.

International Search Report, International Application No. PCT/US00/05751; Date of Mailing: Jul. 25, 2000.

Gokan et al.; "Dry Etch Resistance of Organic Materials," *J. Electrochem. Soc.* 130:1 143–146 (Jan. 1983).

Lin; "Multi–Layer Resist Systems," Introduction to Microlithography, American Chemical Society, pp. 287–350 (1983).

\* cited by examiner

*Primary Examiner*—Alexander Markoff
(74) *Attorney, Agent, or Firm*—Myers Bigel Sibley & Sajovec, P.A.

(57) ABSTRACT

A method of forming a relief image in a structure comprising a substrate and a transfer layer formed thereon comprises covering the transfer layer with a polymerizable fluid composition, and then contacting the polymerizable fluid composition with a mold having a relief structure formed therein such that the polymerizable fluid composition fills the relief structure in the mold. The polymerizable fluid composition is subjected to conditions to polymerize polymerizable fluid composition and form a solidified polymeric material therefrom on the transfer layer. The mold is then separated from the solid polymeric material such that a replica of the relief structure in the mold is formed in the solidified polymeric material; and the transfer layer and the solidified polymeric material are subjected to an environment to selectively etch the transfer layer relative to the solidified polymeric material such that a relief image is formed in the transfer layer.

34 Claims, 2 Drawing Sheets

STEP AND FLASH IMPRINT LITHOGRAPHY

FIELD OF THE INVENTION

The invention generally relates to using lithography techniques in fabricating various microstructures.

BACKGROUND OF THE INVENTION

There is currently a strong trend toward fabricating small structures and downsizing existing structures, which is commonly referred to as microfabrication. One area in which microfabrication has had a sizeable impact is in the microelectronic area. In particular, the downsizing of microelectronic structures has generally allowed the structures to be less expensive, have higher performance, exhibit reduced power consumption, and contain more components for a given dimension relative to conventional electronic devices. Although microfabrication has been widely active in the electronics industry, it has also been applied to other applications such as biotechnology, optics, mechanical systems, sensing devices, and reactors.

Lithographic techniques are often employed in device microfabrication. See S. Wolf et al., *Silicon Processing for the VLSI Era, Volume 1—Process Technology,* (1986), pp. 407–413. Using microcircuitfabrication as an example, photoresist materials are applied to a substrate. Next, the resist layer is selectively exposed to a form of radiation. An exposure tool and mask are often used to effect the desired selective exposure. Patterns in the resist are formed when the substrate undergoes a subsequent "developing" step. The areas of resist remaining after development protect the substrate regions which they cover. Locations from which resist has been removed can be subjected to a variety of additive (e.g., lift-off) or substractive (e.g., etching) processes that transfer the pattern onto the substrate surface.

There is a current move toward developing photolithography techniques that may allow for forming microscale devices with smaller features. Whiteside et al., *Angew. Chem. Int. Ed.,* 1998, 37, pp. 550–575 propose various techniques. One proposed technique involves the self-assembly of monolayers. Self-assembled monolayers (SAMs) typically form spontaneously by chemisorption and self-organization of functionalized, long-chain organic molecules onto the surfaces of appropriate substrates. SAMs are usually prepared by immersing a substrate in a solution containing a ligand that is reactive toward the surface, or by exposing the substrate to a vapor of the reactive species. The self-assembly of monolayers is potentially advantageous in that ordered structures may form rapidly.

An imprint lithography process that teaches producing nanostructures with 10 nm feature sizes is proposed by Chou et al., *Microelectronic Engineering,* 35, (1997), pp. 237–240. In particular, Chou et al. teaches pressing a mold having nanostructures formed therein into a thin resist cast that is present on the surface of a substrate. The resist cast is designed to conform to the mold shape. The mold is then removed from the resist cast and the substrate having the resist cast present thereon is etched such that the mold pattern is transferred to the substrate.

Chou teaches using (poly)methyl methacrylate for the resist cast. The use of this material, however, may be disadvantageous in that it is potentially difficult to form some structures in varying pattern densities. Moreover, it is perceived that the etch selectivity may be potentially undesirable for common microelectronic device processing.

In view of the above, there is a need in the art for an imprint lithography process that allows for the formation of nanostructures having high resolution for a wide range of pattern densities. It would be particularly desirable if the nanostructures could be formed in a more efficient manner relative to prior art processes.

SUMMARY OF THE INVENTION

The present invention addresses the potential problems of the prior art, and in one aspect provides a method of forming a relief image in a structure that comprises a substrate and a transfer layer formed thereon. The method applies to forming structures with nanoscale patterns. The method comprises covering the transfer layer with a polymerizable fluid composition; contacting the polymerizable fluid composition with a mold having a relief structure formed therein such that the polymerizable fluid composition fills the relief structure in the mold; subjecting the polymerizable fluid composition to conditions to polymerize the polymerizable fluid composition and form a solidified polymeric material therefrom on the transfer layer; separating the mold from the solidified polymeric material such that a replica of the relief structure in the mold is formed in the solidified polymeric material; and finally subjecting the transfer layer and the solidified polymeric material to an environment that allows for the selectively etching of the transfer layer relative to the solidified polymeric material such that a relief image is formed in the transfer layer.

DETAILED DESCRIPTION OF THE PREFERRED EMBODIMENTS

Figure 1A:
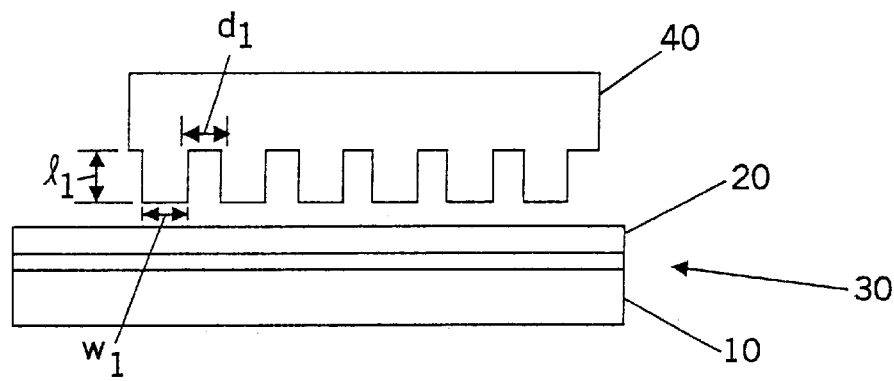
FIG. 1 illustrates a method for forming a relief structure in a substrate in accordance with the invention.

The present invention now will be described more fully hereinafter with reference to the accompanying drawing and specification, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

In one aspect, the invention relates to at least one method of forming a relief image in a structure comprising a substrate and a transfer layer formed thereon. The method comprises covering the transfer layer with a polymerizable fluid composition. The polymerizable fluid composition is then contacted by a mold having a relief structure formed therein such that the polymerizable fluid composition fills the relief structures in the mold. The polymerizable fluid composition is then subjected to conditions so as to polymerize the polymerizable fluid composition and form a solidified polymeric material therefrom on the transfer layer. Stated differently, the polymerizable fluid composition becomes chemically crosslinked or cured so as to form a thermoset material (i.e., solidified polymeric material). The mold is then separated from the solidified polymeric material such that a replica of the relief structure in the mold is formed in the solidified polymeric material. The transfer layer and the solidified polymeric material are then subjected to an environment such that the transfer layer is selectively etched relative to the solidified polymeric material. As a result, a relief image is formed in the transfer layer. The method of the invention is advantageous in that a number of devices may be fabricated therefrom utilizing processes known to one skilled in the art such as, but not limited to, microelectronic devices, information storage devices, printed wiring boards, flat panel displays, micromachines, and charge couple devices.

The substrate used in the above invention may comprise a number of different materials such as, but not limited to, silicon, plastics, gallium arsenide, mercury telluride, and composites thereof. The transfer layers are formed from materials known in the art such as, for example, thermoset polymers, thermoplastic polymers, polyepoxies, polyamides, polyurethanes, polycarbonates, polyesters, and combinations thereof. The transfer layer is fabricated in such a manner so as to possess a continuous, smooth, relatively defect-free surface that may exhibit excellent adhesion to the polymerizable fluid. As appreciated by one skilled in the art, the term "transfer layer" refers to a layer containing material that may be etched so as to transfer an image to the underlying substrate from the polymerizable fluid composition as described in detail herein.

The polymerizable fluid composition that is polymerized and solidified in accordance with the methods of the invention typically comprises a polmerizable material, a diluent, and other materials employed in polymerizable fluids such as, but not limited to, initiators, and other materials. Polymerizable (or crosslinkable) materials which may be used in the methods of the invention preferably encompass various silicon-containing materials that are often present themselves in the form of polymers. The silicon-containing materials include, but not limited to, silanes, silyl ethers, silyl esters, functionalized siloxanes, silsesquioxanes, and mixtures thereof. Silicon-containing materials which are employed preferably are organosilicons. The silicon-containing materials preferably contain the element silicon in an amount greater than about 8 percent based on the weight of the polymerizable fluid composition, and more preferably greater than about 10 weight percent.

The polymers which may be present in the polymerizable fluid composition preferably include various reactive pendant groups. Examples of pendant groups include, but are not limited to, epoxy groups, ketene acetyl groups, acrylate groups, methacrylate groups, and combinations of the above. Although not wishing to be bound by any theory, it is believed that the polymerizable fluid composition may react according to a variety of reaction mechanisms such as, but not limited to, acid catalysis, free radical catalysis, or 2+2 photocycloaddition.

The mold used in the methods of the invention may be formed from various conventional materials. Typically, the materials are selected such that the mold is transparent which allows the polymerizable fluid composition covered by the mold to be exposed to an external radiation source. For example, the mold may comprise materials such as, but not limited to, quartz, silicon, organic polymers, siloxane polymers, borosilicate glass, fluorocarbon polymers, metal, and combinations of the above. Preferably, the mold comprises quartz. To facilitate release of the mold from the solid polymeric material, the mold may be treated with a surface modifying agent. Surface modifying agents which may be employed include those which are known in the art. An example of a surface modifying agent is a fluorocarbon silylating agent. These surface modifying agents or release materials may be applied, for example, from plasma sources, a Chemical Vapor Deposition method (CVD) such as analogs of paralene, or a treatment involving a solution.

It should be appreciated that one skilled in the art may select the substrate, mold, polymerizable fluid composition, surface modifying agent, as well as any other materials such that the method of the invention optimally functions according to the specific needs of the end user.

The methods of the invention will now be described in greater detail to the accompanying drawing in which a preferred embodiment of the invention is shown. FIG. 1a illustrates a step-by-step sequence for carrying out the method of the invention. A structure 30 is present which includes substrate 10 having transfer layer 20 positioned thereon. As shown, mold 40 is aligned over the transfer layer 20 such that gap 50 is formed between the mold 40 and transfer layer 20. Mold 40 has a nanoscale relief structure formed therein having an aspect ratio preferably ranging from about 0.1 to about 10, and more preferably from about 0.5 to about 2. Specifically, the relief structures in the mold preferably have a width $W_1$ ranging from about 10 nm to about 5000 $\mu$m. The relief structures are separated from each other by a distance $d_1$, preferably ranging from about 10 nm to about 5000 $\mu$m.

Figure 1B:
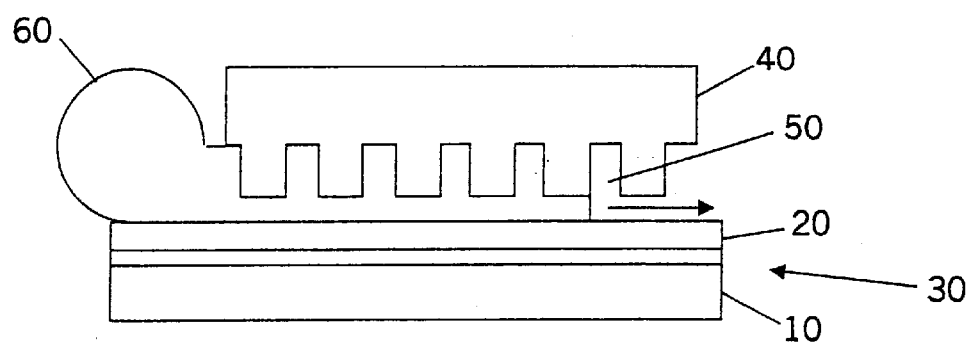

A polymerizable fluid composition 60 then contacts the transfer layer 20 and mold 40 so as to fill the gap 50 therebetween, as shown in FIG. 1b. The polymerizable fluid composition may have a low viscosity such that it may fill the gap in an efficient manner. Preferably, the viscosity of the polymerizable fluid composition ranges from about 0.01 cps to about 100 cps measured at 25° C., and more preferably from about 0.01 cps to about 1 cps measured at this temperature.

Figure 1C:
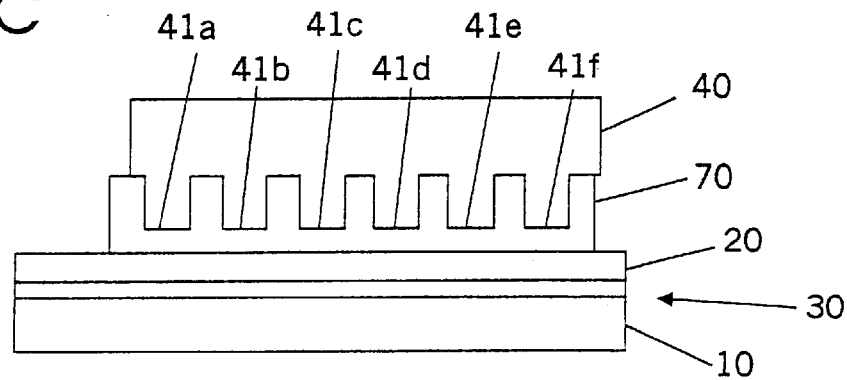

Referring now to FIG. 1c, the mold is then moved closer to the transfer layer 20 to expel excess polymerizable fluid composition 60 such that the edges 41a through 41f of the mold 40 come into contact with the transfer layer 20. The polymerizable fluid composition 60 is then exposed to conditions sufficient to polymerize the fluid. Preferably, the polymerizable fluid composition 60 is exposed to radiation sufficient to polymerize the fluid composition and form a solidified polymeric material represented by 70 in FIG. 1c. More specifically, the polymerizable fluid composition is exposed in to ultraviolet light, although other means for polymerizing the fluid may be employed such as, for example, heat or other forms of radiation. The selection of a method of initiating the polymerization of the fluid composition is known to one skilled in the art, and typically depends on the specific application which is desired.

Figure 1D:
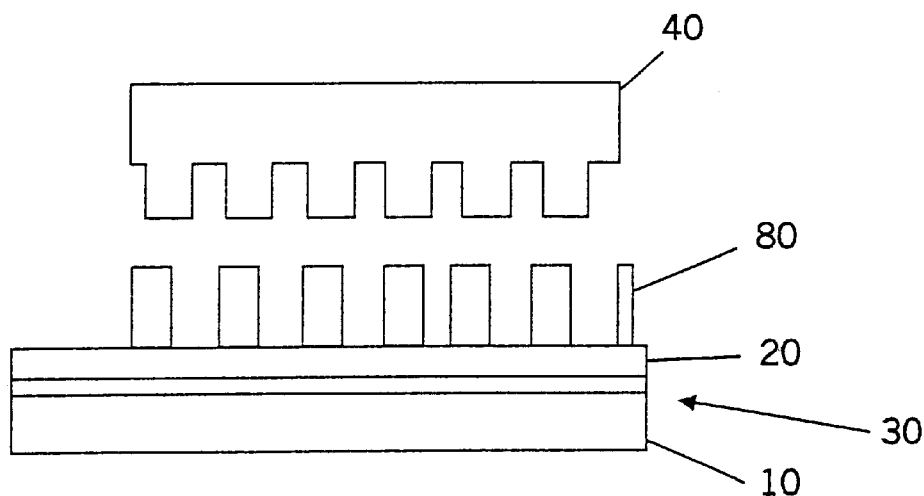
Figure 1E:
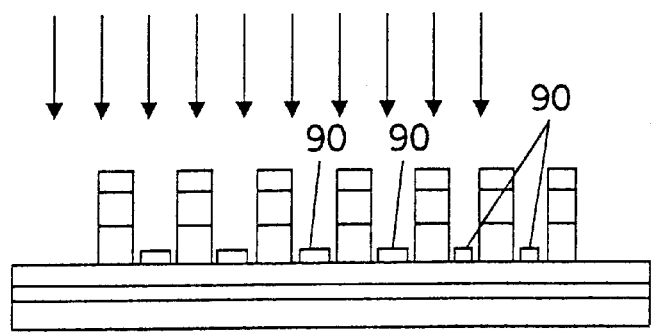

The mold 40 then leaves the solidified polymeric material 70 on the transfer layer 20, as shown in FIG. 1d. The transfer layer 20 is then selectively etched relative to the solid polymeric material 70 such that a relief image 80 corresponding to the image in mold 40 is formed in the transfer layer 20. The etching step is depicted by FIG. 1c. The etching selectivity of the transfer layer 20 relative to the solid polymeric material 70 preferably ranges from about 1.5 to about 100. As an example, the selective etching or ion milling may be carried out may be carried out by subjecting the transfer layer 20 and the solid polymeric material 70 to an environment such as, but not limited to, an argon ion stream, an oxygen-containing plasma, a reactive ion etching gas, a halogen-containing gas, a sulfur dioxide-containing gas, and combinations of the above.

Residual material (denoted as 90), which may be in the form of: (1) a portion of the polymerizable fluid composition, (2) a portion of the solid polymeric material, or (3) combinations of (1) and (2) might be present in the gaps within relief image 80. The method of the invention therefore may further comprise the step of subjecting the residual material 90 to conditions such that the residual material 90 is removed (e.g., a clean-up etch). The clean-up etch may be carried out using known techniques. Additionally, it should be appreciated that this step may be carried out during various stages of the method of the invention. For example, the removal of the residual material may be carried out prior to the step of subjecting the transfer layer and the solid polymeric material to an environment wherein the transfer layer is selectively etched relative to the solid polymeric material. Various environments may be employed during the clean-up etch such as, for example, argon ion milling, a fluorine-containing plasma, a reactive ion etch gas, and combinations thereof.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a relief image in a structure said method comprising:
   covering the substrate with a polymeric transfer layer to provide a continuous, planar surface thereon;
   covering the polymeric transfer layer with a polymerizable fluid composition;
   contacting the polymerizable fluid composition with a mold having a relief structure formed therein such that the polymerizable fluid composition substantially fills the relief structure in the mold;
   subjecting the polymerizable fluid composition to conditions to polymerize polymerizable fluid composition and form a solidified polymeric material therefrom on the transfer layer;
   separating the mold from the solid polymeric material such that a replica of the relief structure in the mold is formed in the solidified polymeric material; and
   subjecting the transfer layer and the solidified polymeric material to an etching environment to etch solidified polymeric material and to selectively etch the transfer layer relative to the solidified polymeric material to form a relief image in the transfer layer providing patterned access to the substrate.

2. A method according to claim 1, further comprising the step of fabricating a device from the structure, the device selected from the group consisting of a microelectronic device, an information storage device, a printed wiring board, a flat panel display, a micromachine, and a charge couple device.

3. A method according to claim 1, wherein the polymerizable fluid composition comprises an organosilane.

4. A method according to claim 3, wherein the organosilane contains elemental silicon in an amount greater than about 8 weight percent based on the weight of the polymerizable fluid composition.

5. A method according to claim 1, wherein the polymerizable fluid composition includes a reactive pendant group selected from the group consisting of an epoxy group, a ketene acetyl group, an acrylate group, a methacrylate group, and combinations thereof.

6. A method according to claim 1, wherein the transfer layer comprises a material selected from the group consisting of an organic thermoset polymer, a thermoplastic polymer, a polyepoxy, a polyamide, a polyurethane, a polycarbonate, a polyester, and combinations thereof.

7. A method according to claim 1, wherein the mold comprises a material selected from the group consisting of metal, silicon, an organic polymer, a siloxane polymer, borosilicate glass, a fluorocarbon polymer, and combinations thereof.

8. A method according to claim 1, wherein the mold comprises quartz.

9. A method according to claim 1, further comprising the step of treating the mold with a surface modifying agent.

10. A method according to claim 9, wherein said step of treating the mold is carried out by employing a technique selected from the group consisting of a plasma technique, a chemical vapor deposition technique, a solution treatment technique, and mixtures thereof.

11. A method according to claim 9, wherein the surface modifying agent is a fluorocarbon silylating agent.

12. A method according to claim 1, wherein the mold is transparent and wherein said step of subjecting the polymerizable fluid composition comprises subjecting the polymerizable fluid composition to radiation sufficient to polymerize the fluid composition and to form a solid polymeric material.

13. A method according to claim 1, wherein said step of subjecting the transfer layer and the solid polymeric ma rial to an environment comprises subjecting the transfer layer and the solid polymeric material to an environment comprising an argon ion stream, an oxygen-containing plasma, a reactive ion etch gas, a halogenated-containing gas, a sulfur dioxide-containing gas, and combinations thereof.

14. A method according to claim 1, wherein residual material selected from the group consisting of a portion of the polymerizable fluid composition, a portion of the solid polymeric material, and combinations thereof is present subsequent to said step of subjecting the polymerizable fluid composition to conditions to form a solid polymeric material, and said method further comprising the step of subjecting the residual material to conditions such that the residual material is removed.

15. A method according to claim 14, wherein said step of subjecting the residual material occurs prior to said step of subjecting the transfer layer and the solid polymeric material to an environment to selectively etch the transfer layer relative to the solid polymeric material.

16. A method according to claim 14, wherein said step of subjecting the residual material to conditions such that the residual material is removed comprises subjecting the residual material to an environment selected from the group consisting of an argon ion stream, a fluorine-containing plasma, a reactive ion etch gas, and mixtures thereof.

17. A method according to claim 11, wherein said substrate is preformed prior to said step of covering the substrate with a polymeric transfer layer.

18. A method of forming a relief image in a structure said method comprising:
   covering the substrate with a polymeric transfer layer to provide a continuous, planar surface thereon;
   covering the polymeric transfer layer with a polymerizable fluid composition comprising a silicon-containing material;
   contacting the polymerizable fluid composition with a mold having a relief structure formed therein such that the polymerizable fluid composition substantially fills the relief structure in the mold;
   subjecting the polymerizable fluid composition to conditions to polymerize polymerizable fluid composition and form a solidified polymeric material therefrom on the transfer layer;

separating the mold from the solid polymeric material such that a replica of the relief structure in the mold is formed in the solidified polymeric material; and subjecting the transfer layer and the solidified polymeric material to an etching environment to etch solidified polymeric material and to selectively etch the transfer layer relative to the solidified polymeric material to form a relief image in the transfer layer providing patterned access to the substrate.

19. A method according to claim 18, further comprising the step of fabricating a device from the structure, the device selected from the group consisting of a microelectronic device, an information storage device, a printed wiring board, a flat panel display, a micromachine, and a charge couple device.

20. A method according to claim 18, wherein the polymerizable fluid composition comprises an organosilane.

21. A method according to claim 20, wherein the organosilane contains elemental silicon in an amount greater than about 8 weight percent based on the weight of the polymerizable fluid composition.

22. A method according to claim 18, wherein the polymerizable fluid composition includes a reactive pendant group selected from the group consisting of an epoxy group, a ketene acetyl group, an acrylate group, a methacrylate group, and combinations thereof.

23. A method according to claim 18, wherein the transfer layer comprises a material selected from the group consisting of an organic thermoset polymer, a thermoplastic polymer, a polyepoxy, a polyamide, a polyurethane, a polycarbonate, a polyester, and combinations thereof.

24. A method according to claim 18, wherein the mold comprises a material selected from the group consisting of metal, silicon, an organic polymer, a siloxane polymer, borosilicate glass, a fluorocarbon polymer, and combinations thereof.

25. A method according to claim 18, wherein the mold comprises quartz.

26. A method according to claim 18, further comprising the step of treating the mold with a surface modifying agent.

27. A method according to claim 26, wherein said step of treating the mold is carried out by employing a technique selected from the group consisting of a plasma technique, a chemical vapor deposition technique, a solution treatment technique, and mixtures thereof.

28. A method according to claim 26, wherein the surface modifying agent is a fluorocarbon silylating agent.

29. A method according to claim 18, wherein the mold is transparent and wherein said step of subjecting the polymerizable fluid composition comprises subjecting the polymerizable fluid composition to radiation sufficient to polymerize the fluid composition and to form a solid polymeric material.

30. A method according to claim 18, wherein said step of subjecting the transfer layer and the solid polymeric material to an environment comprises subjecting the transfer layer and the solid polymeric material to an environment comprising an argon ion stream, an oxygen-containing plasma, a reactive ion etch gas, a halogenated-containing gas, a sulfur dioxide-containing gas, and combinations thereof.

31. A method according to claim 18, wherein residual material selected from the group consisting of a portion of the polymerizable fluid composition, a portion of the solid polymeric material, and combinations thereof is present subsequent to said step of subjecting the polymerizable fluid composition to conditions to form a solid polymeric material, and said method further comprising the step of subjecting the residual material to conditions such that the residual material is removed.

32. A method according to claim 31, wherein said step of subjecting the residual material occurs prior to said step of subjecting the transfer layer and the solid polymeric material to an environment to selectively etch the transfer layer relative to the solid polymeric material.

33. A method according to claim 31, wherein said step of subjecting the residual material to conditions such that the residual material is removed comprises subjecting the residual material to an environment selected from the group consisting of an argon ion stream, a fluorine-containing plasma, a reactive ion etch gas, and mixtures thereof.

34. A method according to claim 18, wherein said substrate is preformed prior to said step of covering the substrate with a polymeric transfer layer.

* * * * *

UNITED STATES PATENT AND TRADEMARK OFFICE
CERTIFICATE OF CORRECTION

PATENT NO. : 6,334,960 B1
DATED : January 1, 2002
INVENTOR(S) : Carlton Grant Willson and Matthew Earl Colburn It is certified that error appears in the above-identified patent and that said Letters Patent is hereby corrected as shown below:

Column 1,
Line 2, please add the following:
-- FEDERALLY SPONSORED RESEARCH
This invention was made with Government support under Defense Advanced Research Projects Agency (DARPA) Agreement No. MDA-972-97-3-0007. The Government has certain rights to this invention.

Signed and Sealed this

Eleventh Day of November, 2003

JAMES E. ROGAN
*Director of the United States Patent and Trademark Office*